United States Patent
Hsu

(10) Patent No.: US 10,429,417 B2
(45) Date of Patent: Oct. 1, 2019

(54) BROWN-OUT DETECTORS

(71) Applicant: SYNCMOS TECHNOLOGIES INTERNATIONAL, INC., Hsinchu (TW)

(72) Inventor: Jhih Yuan Hsu, Hsinchu (TW)

(73) Assignee: SYNCMOS TECHNOLOGIES INTERNATIONAL, INC., Hsinchu (TW)

( * ) Notice: Subject to any disclaimer, the term of this patent is extended or adjusted under 35 U.S.C. 154(b) by 0 days.

(21) Appl. No.: 16/114,073

(22) Filed: Aug. 27, 2018

(65) Prior Publication Data

US 2019/0137548 A1 May 9, 2019

(30) Foreign Application Priority Data

Sep. 1, 2017 (CN) .......................... 2017 1 0781197

(51) Int. Cl.
*G01R 19/165* (2006.01)
*H03K 17/22* (2006.01)

(52) U.S. Cl.
CPC ..... *G01R 19/16538* (2013.01); *H03K 17/223* (2013.01)

(58) Field of Classification Search
CPC .................. G01R 19/16538; H03K 17/223
See application file for complete search history.

(56) References Cited

U.S. PATENT DOCUMENTS

2004/0239413 A1* 12/2004 Gubbins .............. H03K 17/145
327/539

FOREIGN PATENT DOCUMENTS

| CN | 1996204 A | 7/2007 |
| TW | I-458995 B | 11/2014 |

OTHER PUBLICATIONS

Taiwan Intellectual Property Office, Office Action dated Sep. 3, 2018, in Taiwan Patent Application No. 106138505.

* cited by examiner

*Primary Examiner* — Daniel C Puentes
(74) *Attorney, Agent, or Firm* — Faegre Baker Daniels LLP

(57) ABSTRACT

Brown-out detector and method thereof. For example, the brown-out detector includes a variable resistor and a P-type current mirror including a P-type transistor associated with a threshold on-voltage. The P-type current mirror is configured to generate a characteristic voltage of a supply voltage and generate a characteristic current flowing through the variable resistor to generate a reference voltage based at least in part on the characteristic current. Additionally, the brown-out detector includes a voltage comparator configured to compare the characteristic voltage and the reference voltage and output a signal indicating a comparison result, and a controller. The threshold on-voltage is associated with a first rate of thermal change, and the characteristic current is associated with a second rate of thermal change.

34 Claims, 4 Drawing Sheets

BROWN-OUT DETECTORS

1. CROSS-REFERENCES TO RELATED APPLICATIONS

This application claims priority to Chinese Patent Application No. 201710781197.0, filed Sep. 1, 2017, incorporated by reference herein for all purposes.

2. BACKGROUND OF THE INVENTION

Certain embodiments of the present invention are directed to circuits. More particularly, some embodiments of the invention provide brown-out detectors. Merely by way of example, some embodiments of the invention have been applied to an electronic system. But it would be recognized that the invention has a much broader range of applicability.

Traditionally, an electronic system or component needs a stable power supply to ensure the electronic system or component functions properly. If the power supply of the electronic system or component is unstable, the electronic system or component may be damaged or malfunctioned.

For example, in an electronic system including a microprocessor or microcontroller unit (MCU), a brown-out detector of the electronic system is configured to monitor a supply voltage of a power supply of the microprocessor or microcontroller unit in real-time, and to output a reset signal to prompt the microprocessor or microcontroller unit to reset when the supply voltage falls below a threshold voltage. The reset process of the microprocessor or microcontroller unit is quite important because the semiconductor components of the microprocessor or microcontroller unit have minimum operating voltage limits. If the microprocessor or microcontroller unit fails to reset properly, the data stored at the internal buffer or memory of the microprocessor or microcontroller unit can be lost, causing an error in the program of the microprocessor or microcontroller unit.

With advancements in technology, the use of mobile devices has become widespread, and many mobile devices use batteries to supply power. A brown-out detector is generally needed for a mobile device, which uses a battery to supply power, for monitoring the battery voltage in real-time such that the mobile device is notified to take action when the battery voltage falls below a predetermined threshold voltage value. It is desirable for the brown-out detector to have minimal current consumption. However, a traditional brown-out detector often utilizes a bandgap reference voltage source as a reference voltage source that has very low temperature drift, preventing current consumption of the traditional brown-out detector from being minimized and thus from being applied to low-power products.

FIG. 1 is an exemplary circuit diagram showing a conventional brown-out detector using a bandgap reference voltage source. As shown in FIG. 1, the brown-out detector 10 includes a resistor-based voltage divider 110, a bandgap reference voltage source 120, a voltage comparator 130, and a delay circuit 140. The voltage divider 110 generates a characteristic voltage $V_{res}$ of a supply voltage $V_D$, the bandgap reference voltage source 120 generates a reference voltage $V_{ref}$ that is constant and independent from the supply voltage $V_D$ and temperature variations. The voltage comparator 130 compares the characteristic voltage $V_{res}$ and the reference voltage $V_{ref}$. If $V_{res} < V_{ref}$, the voltage comparator 130 outputs a logic high level to indicate that the supply voltage $V_D$ is smaller than a detection threshold voltage $V_{DD}$.

As depicted by the circuit diagram shown in FIG. 1, the relationship between the detection threshold voltage $V_{DD}$ and the reference voltage $V_{ref}$ is as follows:

$$V_{DD} \cdot \frac{R_B}{R_A + R_B} = V_{ref} \quad \text{(Equation 1)}$$

$$V_{DD} = V_{ref} \cdot \frac{R_A + R_B}{R_B} \quad \text{(Equation 2)}$$

3. BRIEF SUMMARY OF THE INVENTION

In view of one or more problems described above, certain embodiments of the invention provide brown-out detectors.

According to some embodiments, a brown-out detector includes a P-type current mirror, a variable resistor, a voltage comparator, and a controller, wherein the P-type current mirror generates a characteristic voltage and a characteristic current of a supply voltage, wherein the controller sets an equivalent resistance value of the variable resistor based on a first rate of thermal change of a threshold on-voltage of a P-type transistor of the P-type current mirror and a second rate of thermal change of the characteristic current, wherein the characteristic current flows through the variable resistor to generate a reference voltage, and wherein the voltage comparator compares the characteristic voltage with the reference voltage and outputs a signal indicating the comparison result.

According to certain embodiments, a brown-out detector includes a variable resistor and a P-type current mirror including a P-type transistor associated with a threshold on-voltage. The P-type current mirror is configured to generate a characteristic voltage of a supply voltage and generate a characteristic current flowing through the variable resistor to generate a reference voltage based at least in part on the characteristic current. Additionally, the brown-out detector includes a voltage comparator configured to compare the characteristic voltage and the reference voltage and output a signal indicating a comparison result, and a controller. The threshold on-voltage is associated with a first rate of thermal change, and the characteristic current is associated with a second rate of thermal change. The controller is configured to set an equivalent resistance value of the variable resistor based at least in part on the first rate of thermal change and the second rate of thermal change.

According to some embodiments, a brown-out detector includes a variable resistor and a current mirror including a transistor associated with a threshold voltage. The current mirror is configured to generate a first voltage representing a supply voltage received by the current mirror and generate a first current flowing through the variable resistor to generate a second voltage based at least in part on the first current. Additionally, the brown-out detector includes a comparator configured to receive the first voltage and the second voltage and generate a comparison signal based at least in part on the first voltage and the second voltage, and a controller coupled to the variable resistor and configured to vary an equivalent resistance value of the variable resistor. An absolute value of the threshold voltage changes with temperature at a first rate of change, and the first current changes with temperature at a second rate of change. The controller is further configured to set the equivalent resistance value of the variable resistor based at least in part on the first rate of change and the second rate of change.

According to certain embodiments, a method for detecting a power failure includes setting an equivalent resistance value of a variable resistor, and generating a characteristic voltage of a supply voltage by a P-type current mirror including a P-type transistor associated with a threshold on-voltage. Additionally, the method includes generating a characteristic current flowing through the variable resistor, processing information associated with the characteristic current, generating a reference voltage based at least in part on the characteristic current by the variable resistor, comparing the characteristic voltage and the reference voltage, and outputting a signal indicating a comparison result based at least in part on the characteristic voltage and the reference voltage. The threshold on-voltage is associated with a first rate of thermal change, and the characteristic current is associated with a second rate of thermal change. The setting an equivalent resistance value of a variable resistor includes setting the equivalent resistance value of the variable resistor based at least in part on the first rate of thermal change and the second rate of thermal change.

According to some embodiments, a method for detecting a power failure includes varying an equivalent resistance value of a variable resistor, receiving a supply voltage by a current mirror including a transistor associated with a threshold voltage, generating a first voltage representing the supply voltage by the current mirror, generating a first current by the current mirror, outputting the first current to flow through the variable resistor, generating a second voltage based at least in part on the first current, receiving the first voltage and the second voltage, and outputting a comparison signal based at least in part on the first voltage and the second voltage. An absolute value of the threshold voltage changes with temperature at a first rate of change, and the first current changes with temperature at a second rate of change. The varying an equivalent resistance value of a variable resistor includes setting the equivalent resistance value of the variable resistor based at least in part on the first rate of change and the second rate of change.

Depending upon embodiment, one or more benefits may be achieved. For example, a brown-out detector can be configured such that its detection threshold voltage exhibits very low temperature drift without using a bandgap reference voltage source, thus making the brown-out detector very suitable for low-power electronic devices. These benefits and various additional objects, features and advantages of the present invention can be fully appreciated with reference to the detailed description and accompanying drawings that follow.

4. BRIEF DESCRIPTION OF THE DRAWINGS

According to various examples, other features, purposes, and advantages of the present invention will become apparent upon reading the detailed description of the following exemplary drawings, which describe features of one or more non-limiting embodiments. For example, the same or similar reference numerals indicate the same or similar features.

5. DETAILED DESCRIPTION OF THE INVENTION

Certain embodiments of the present invention are directed to circuits. More particularly, some embodiments of the invention provide brown-out detectors. Merely by way of example, some embodiments of the invention have been applied to an electronic system. But it would be recognized that the invention has a much broader range of applicability.

Based on the above Equations 1 and 2, the accuracy of the detection threshold voltage $V_{DD}$ is directly related to the accuracy of the reference voltage $V_{ref}$ according to certain embodiments. For example, in theory, the bandgap voltage reference source 120 can generate a constant reference voltage $V_{ref}$ independent from the supply voltage $V_D$ and temperature variations. However, as an example, in practice, the reference voltage $V_{ref}$ generated by the bandgap reference voltage source 120 is affected by imperfections in the semiconductor manufacturing process of the bandgap reference voltage source 120. According to some embodiments, to reduce imperfections in the semiconductor manufacturing process of the bandgap reference voltage source 120, it is necessary to increase the operating current of the bandgap reference voltage source 120 and the area of the transistor in the bandgap reference voltage source 120. For example, to increase the operation current of the bandgap reference voltage source 120, the resistance value of the bandgap reference voltage source 120 needs to be reduced and thus leading the overall chip area of the bandgap reference voltage source 120 to increase, resulting in significant increase in power consumption.

In view of the above, certain embodiments of the present invention provide a brown-out detector, which exhibits low power consumption, is almost unaffected by temperature variations, and can minimize circuit power consumption and chip area according to some embodiments.

Figure 2:
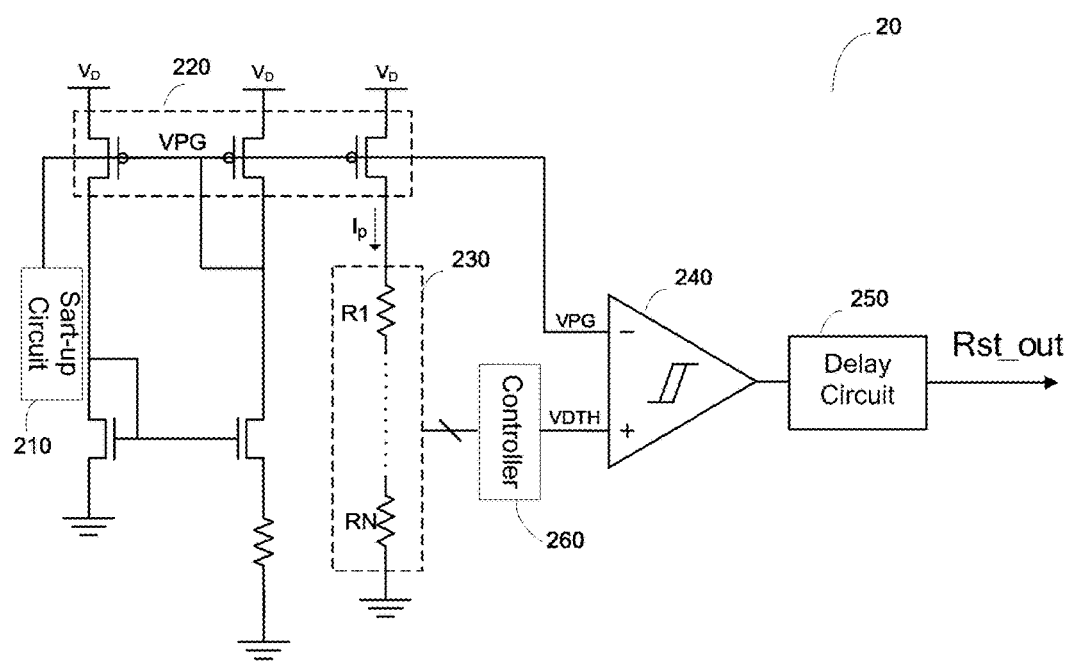
FIG. 2 is a simplified circuit diagram showing a brown-out detector according to some embodiments of the present invention.

FIG. 2 is a simplified circuit diagram showing a brown-out detector according to some embodiments of the present invention. This diagram is merely an example, which should not unduly limit the scope of the claims. One of ordinary skill in the art would recognize many variations, alternatives, and modifications. The brown-out detector 20 includes a start-up circuit 210, a P-type current mirror 220, a variable resistor 230, a voltage comparator 240, a delay circuit 250, and a controller 260. Although the above has been shown using a selected group of components for the brown-out detector, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some examples, after the brown-out detector 20 is powered on, the start-up circuit 210 is configured to initialize the P-type current mirror 220 such that the P-type current mirror 220 operates properly. In certain examples, once operating properly, the P-type current mirror 220 generates a characteristic voltage $V_{PG}$ of a supply voltage $V_D$ (e.g., $V_{PG}$ being positively proportional to $V_D$) and generates a characteristic current $I_p$. As an example, as shown in FIG. 2, the P-type current mirror 220 includes multiple P-type transistors, all of which have the same threshold on-voltage (e.g., the same value of threshold voltage for P-type transistor). In some examples, the P-type transistors of the P-type current mirror 220 operate in the saturation region, and the characteristic current $I_p$ is substantially independent of the supply voltage $V_D$ (e.g., the characteristic current $I_p$ remains substantially constant with respect to the changing supply voltage $V_D$). For example, the P-type transistors of the P-type current mirror 220 operate in the saturation region, and the characteristic current $I_p$ is independent of the supply voltage $V_D$ (e.g., the characteristic current $I_p$ remains constant with respect to the changing supply voltage $V_D$).

In certain embodiments, the variable resistor 230 exhibits an equivalent resistance value $R_{var}$ under the control of the controller 260, and the characteristic current $I_p$ flows through the variable resistor 230 to generate a reference voltage $V_{DTH}$. In some embodiments, the voltage comparator 240 compares the characteristic voltage $V_{PG}$ and the reference voltage $V_{DTH}$ and outputs a signal that indicates the comparison result. In certain embodiments, the delay circuit 250 generates a reset signal (e.g., the signal $R_{st\_out}$ as shown in FIG. 2) by delaying the signal that indicates the comparison result by a predetermined period of time (e.g., to filter noise of the power supply), and outputs the reset signal (e.g., outputs the signal $R_{st\_out}$ to the outside as shown in FIG. 2).

In some examples, the P-type transistors of the P-type current mirror 220 operate in the saturation region, and the reference voltage $V_{DTH}$ is substantially independent of the characteristic voltage $V_{PG}$ (e.g., the reference voltage $V_{DTH}$ remains substantially constant with respect to the changing characteristic voltage $V_{PG}$). For example, the P-type transistors of the P-type current mirror 220 operate in the saturation region, and the reference voltage $V_{DTH}$ is independent of the characteristic voltage $V_{PG}$ (e.g., the reference voltage $V_{DTH}$ remains constant with respect to the changing characteristic voltage $V_{PG}$).

As shown in FIG. 2, according to some embodiments, if $V_{PG}<(V_{DTH}-\Delta)$, the signal that indicates the comparison result is at a logic high level, indicating that the supply voltage $V_D$ is less than the detection threshold voltage $V_{DD}$; and according to certain embodiments, if $V_{PG}>(V_{DTH}+\Delta)$, the signal that indicates the comparison result is at a logic low level, indicating that the supply voltage $V_D$ is higher than the detection threshold voltage $V_{DD}$. For example, A is a constant greater than zero. As an example, A is a constant equal to zero.

In some embodiments, if $V_{PG}<V_{DTH}$, the signal that indicates the comparison result is at a logic high level, indicating that the supply voltage $V_D$ is less than the detection threshold voltage $V_{DD}$; and in certain embodiments, if $V_{PG}>V_{DTH}$, the signal that indicates the comparison result is at a logic low level, indicating that the supply voltage $V_D$ is greater than the detection threshold voltage $V_{DD}$. In some examples, the relationship between the characteristic voltage $V_{PG}$ and the supply voltage $V_D$ is as follows:

$$V_D-|V_{GSp}|=V_{PG} \quad \text{(Equation 3)}$$

where $V_{GSp}$ is an on-voltage of a P-type transistor of the P-type current mirror 220, and is independent of the supply voltage $V_D$. Therefore $V_{PG}$ is positively proportional to the supply voltage $V_D$ according to certain embodiments.

In certain examples, the relationship between the characteristic current $I_p$ and the reference voltage $V_{DTH}$ is as follows:

$$V_{DTH}=I_p \times R_{var} \quad \text{(Equation 4)}$$

and in some examples, the relationship between the detection threshold voltage $V_{DD}$ and the reference voltage $V_{DTH}$ is as follows:

$$V_{DTH}=V_{DD}-|V_{GSp}|=I_p \times R_{var} \quad \text{(Equation 5)}$$

$$V_{DD}=(I_p \times R_{var})+|V_{GSp}| \quad \text{(Equation 6)}$$

In some embodiments, since the on-voltage of a P-type transistor of the P-type current mirror 220 changes with temperature variations, the characteristic voltage $V_{PG}$ also changes with temperature variations. In certain embodiments, according to the operating principle of the voltage comparator 240, in order for the comparison result to be independent from temperature variation, the change $\Delta V_{DTH}$ in the reference voltage $V_{DTH}$ as a result of a temperature change (e.g., thermal change of the reference voltage) is to be equal to the change $\Delta V_{PG}$ in the characteristic voltage $V_{PG}$ as a result of the temperature change (e.g., thermal change of the characteristic voltage). For example, $\Delta V_{DTH}=\Delta V_{PG}$. As an example, the temperature change is denoted as $(T-T_{ref})$.

In certain embodiments, a rate of thermal change of a voltage or current shows how the voltage or current changes with changing temperature. For example, a positive rate of thermal change of a voltage or current shows how much the voltage or current increases with increasing temperature, and/or how much the voltage or current decreases with decreasing temperature. As an example, a negative rate of thermal change of a voltage or current shows how much the voltage or current decreases with increasing temperature, and/or how much the voltage or current increases with decreasing temperature.

In some embodiments, a rate of thermal change of the absolute value of a voltage or current shows how the absolute value of the voltage or current changes with changing temperature. For example, a positive rate of thermal change of the absolute value of a voltage or current shows how much the absolute value of the voltage or current increases with increasing temperature, and/or how much the absolute value of the voltage or current decreases with decreasing temperature. As an example, a negative rate of thermal change of the absolute value of a voltage or current shows how much the absolute value of the voltage or current decreases with increasing temperature, and/or how much the absolute value of the voltage or current increases with decreasing temperature.

According to some embodiments, if the on-voltage of a P-type transistor of the P-type current mirror 220 is substantially equal to the threshold on-voltage (e.g., the threshold voltage of the P-type transistor of the P-type current mirror 220), and if the temperature coefficient of the variable resistor 230 (e.g., the temperature coefficient of resistance) is so small that the equivalent resistance value $R_{var}$ of the variable resistor 230 is negligibly affected by the change in temperature, the relationship between $\Delta V_{PG}$, $\Delta V_{DTH}$, and temperature change $(T-T_{ref})$ is, for example, as follows:

$$\Delta V_{PG}=\Delta V_{GSP}\cong\Delta V_{THP}=K_{vth}(T-T_{ref}) \quad \text{(Equation 7)}$$

$$\Delta V_{DTH}=\Delta I_p * R \text{ var}=K_{IP}(T-T_{ref}) \quad \text{(Equation 8)}$$

where $V_{THP}$ is the threshold on-voltage of a P-type transistor of the P-type current mirror 220, $\Delta V_{THP}$ is a change in $V_{THP}$ in response to the temperature change (e.g., thermal change of the threshold on-voltage of a P-type transistor), $K_{vth}$ is the rate of thermal change of $|V_{THP}|$ (e.g., the absolute value of the threshold on-voltage) of a P-type transistor of the P-type current mirror 220, $\Delta I_p$ is a change in the characteristic current $I_p$ in response to the temperature change (e.g., thermal change of the characteristic current), $K_{IP}$ is the rate of thermal change of the characteristic current $I_p$. As an example, $K_{IP}$ and $K_{vth}$ can be predetermined by calibration. For example, $K_{vth}$=−1 mv/° C.~−2 mv/° C. As an example, $K_{IP}$ is greater than zero, and $K_{vth}$ is less than zero.

According to certain embodiments, if $R_{var}$=|$K_{vth}$|/$K_{IP}$, with $K_{IP}$ being greater than zero, the thermal change $\Delta V_{DTH}$ of the reference voltage $V_{DTH}$ is almost equal to the thermal change $\Delta V_{PG}$ of the characteristic voltage $V_{PG}$, and the output result of the brown-out detector 20 (e.g., the signal $R_{st\_out}$ as shown in FIG. 2) is almost independent from temperature variations. For example, $R_{var}$ is the equivalent resistance value of the variable resistor 230, $K_{vth}$ is the rate of thermal change of |$V_{THP}$| (e.g., the absolute value of the threshold on-voltage) of a P-type transistor of the P-type current mirror 220, and $K_{IP}$ is the rate of thermal change of the characteristic current $I_p$. As an example, if $R_{var}$=|$K_{vth}$|/$K_{IP}$, with $K_{IP}$ being greater than zero, the output result of the brown-out detector 20 (e.g., the signal $R_{st\_out}$ as shown in FIG. 2) almost does not change with the changing temperature.

According to some embodiments, if $R_{var}$=|$K_{vth}$|/$K_{IP}$, with $K_{IP}$ being greater than zero, the thermal change $\Delta V_{DTH}$ of the reference voltage $V_{DTH}$ is equal to the thermal change $\Delta V_{PG}$ of the characteristic voltage $V_{PG}$, and the output result of the brown-out detector 20 (e.g., the signal $R_{st\_out}$ as shown in FIG. 2) is independent from temperature variations. For example, $R_{var}$ is the equivalent resistance value of the variable resistor 230, $K_{vth}$ is the rate of thermal change of |$V_{THP}$| (e.g., the absolute value of the threshold on-voltage) of a P-type transistor of the P-type current mirror 220, and $K_{IP}$ is the rate of thermal change of the characteristic current $I_p$. As an example, if $R_{var}$=|$K_{vth}$|/$K_{IP}$, with $K_{IP}$ being greater than zero, the output result of the brown-out detector 20 (e.g., the signal $R_{st\_out}$ as shown in FIG. 2) does not change with the changing temperature.

In some embodiments, in order to facilitate the controller 260 to control the equivalent resistance value $R_{var}$ of the variable resistor 230, the variable resistor 230 includes multiple resistors connected in series, and each resistor of the multiple resistors has the same resistance value and the same thermal coefficient (e.g., the same temperature coefficient of resistance). For example, as shown in FIG. 2, the variable resistor 230 includes N resistors that include resistors $R_1$ through $R_N$, and these N resistors generate N voltage levels that are not at the ground voltage level, where N is a positive integer. In certain embodiments, as shown in FIG. 2, the N voltage levels are received by the controller 260, which selects one voltage level from the N voltage levels and outputs the selected voltage level as the reference voltage $V_{DTH}$. For example, the selected voltage level corresponds to the equivalent resistance value $R_{var}$ of the variable resistor 230. As an example, the controller 260 varies the equivalent resistance value $R_{var}$ of the variable resistor 230 by changing which of the N voltage levels is selected as the selected voltage level. For example, the controller 260 sets the equivalent resistance value $R_{var}$ of the variable resistor 230 by setting (e.g., by fixing without further change) which of the N voltage levels is selected as the selected voltage level, which is outputted as the reference voltage $V_{DTH}$.

Figure 3:
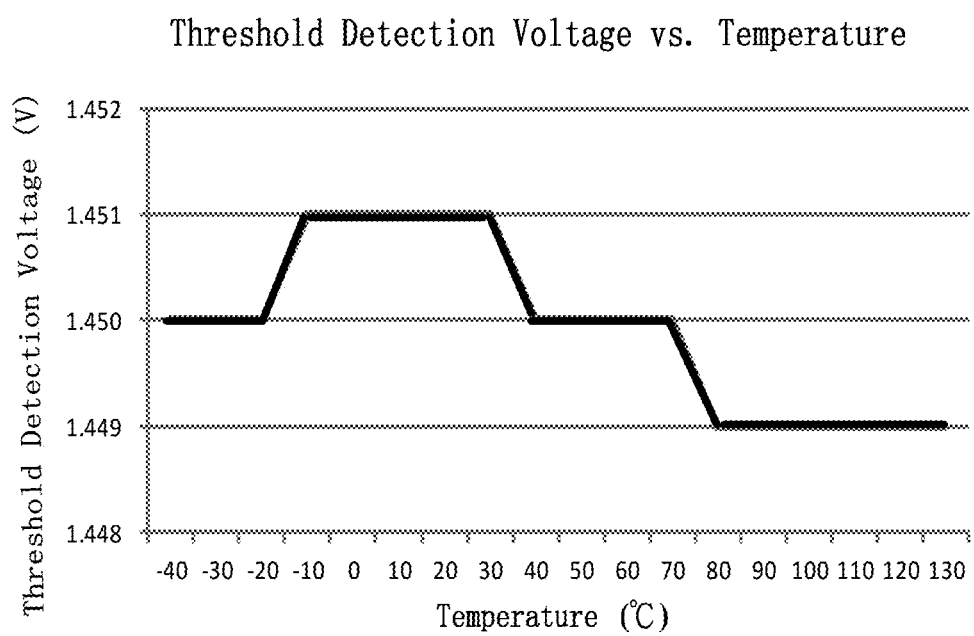
FIG. 3 is a simplified schematic showing a simulated result of threshold voltage at different temperatures of the brown-out detector as shown in FIG. 2 according to some embodiments of the present invention.

FIG. 3 is a simplified schematic showing a simulated result of threshold voltage at different temperatures of the brown-out detector as shown in FIG. 2 according to some embodiments of the present invention. This schematic is merely an example, which should not unduly limit the scope of the claims. One of ordinary skill in the art would recognize many variations, alternatives, and modifications. As shown in FIG. 3, the error in the detection threshold voltage of the brown-out detector 20 caused by the temperature change is ±0.001V, which is negligible.

Figure 1:
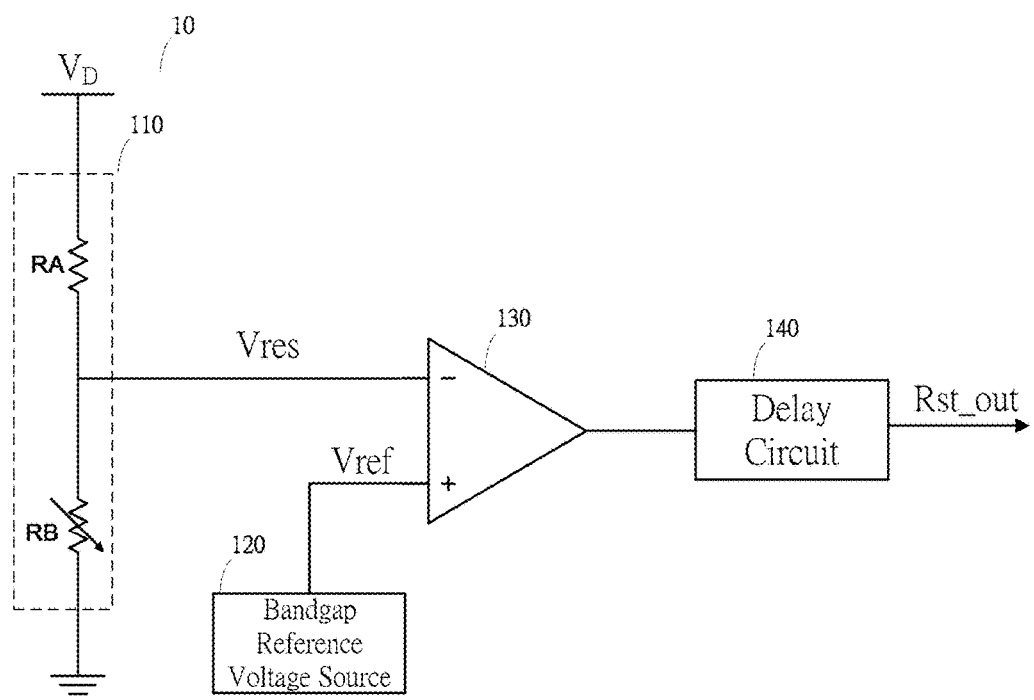
FIG. 1 is an exemplary circuit diagram showing a conventional brown-out detector using a bandgap reference voltage source.

According to certain embodiments, in the brown-out detector 20 of FIG. 2, the thermal change $\Delta V_{DTH}$ of the reference voltage $V_{DTH}$ can replicate the thermal change $\Delta V_{PG}$ of the characteristic voltage $V_{PG}$, thus the output result of the voltage comparator 240 can exhibit very low temperature drift. For example, if the thermal coefficient (e.g., the temperature coefficient of resistance) of the one or more resistors of the variable resistor 230 is sufficiently small, the operating temperature of the brown-out detector 20 as shown in FIG. 2 can even exceed the specified range of one or more transistors (e.g., −40 to 125° C.). As an example, the brown-out detector 20 as shown in FIG. 2 does not utilize a bandgap reference voltage source and hence has lower power consumption and smaller chip size than the brown-out detector 10 as shown in FIG. 1.

According to some embodiments, since the thermal change $\Delta V_{DTH}$ of the reference voltage $V_{DTH}$ in FIG. 2 is fixed, the detection threshold voltage $V_{DD}$ of the brown-out detector 20 is also fixed. For example, the brown-out detector 20 is configured to detect power failure against one threshold voltage (e.g., $V_{DD}$). As an example, a power failure is detected by the brown-out detector 20 if the supply voltage $V_D$ drops below the threshold voltage $V_{DD}$.

Figure 4:
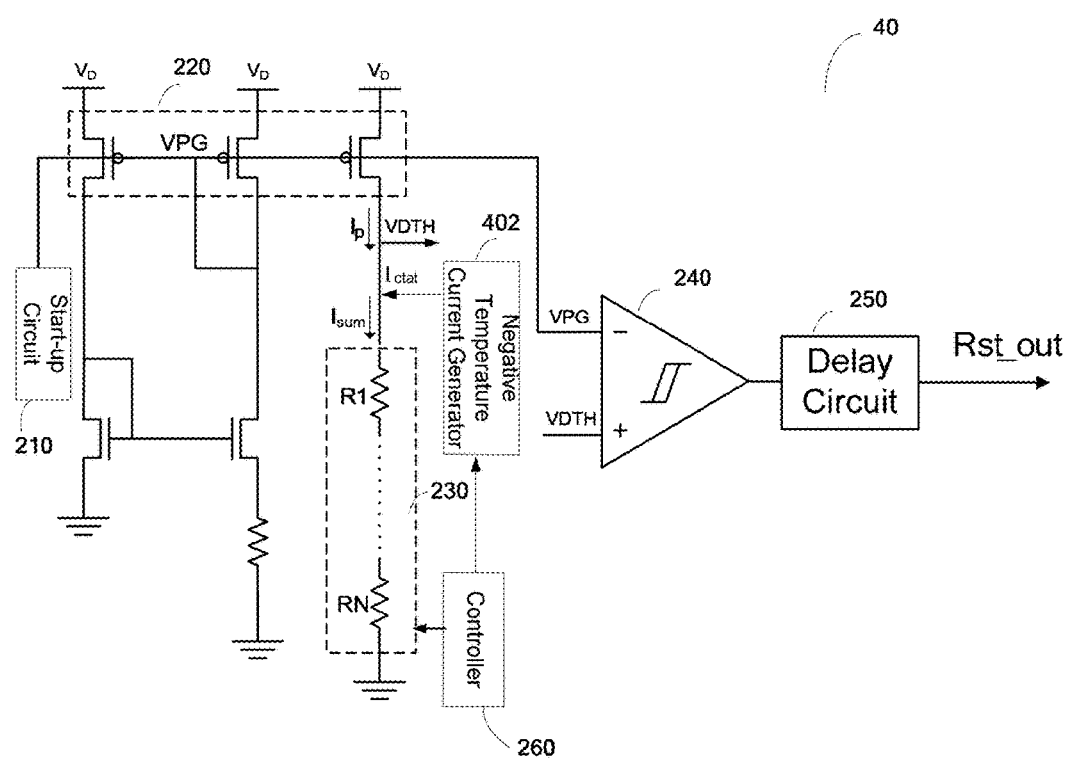
FIG. 4 is a simplified circuit diagram showing a brown-out detector according to certain embodiments of the present invention.

FIG. 4 is a simplified circuit diagram showing a brown-out detector according to certain embodiments of the present invention. This diagram is merely an example, which should not unduly limit the scope of the claims. One of ordinary skill in the art would recognize many variations, alternatives, and modifications. As an example, compared to the brown-out detector 20 of FIG. 2, the brown-out detector 40 as shown in FIG. 4 is configured to detect power failure against multiple detection threshold voltages (e.g., $V_{DD}$). As an example, a power failure is detected by the brown-out detector 40 if the supply voltage (e.g., $V_D$) drops below the corresponding threshold voltage selected from the multiple detection threshold voltages ($V_{DD}$).

In some embodiments, specifically, the brown-out detector 40 as shown in FIG. 4 includes a negative temperature current generator 402 in addition to the start-up circuit 210, the P-type current mirror 220, the variable resistor 230, the voltage comparator 240, the delay circuit 250, and the controller 260. As an example, the negative temperature current generator 402 is configured to generate a negative temperature current $I_{ctat}$. For example, the negative temperature current $I_{ctat}$ is inversely proportional to temperature under the control of the controller 260. As an example, the P-type current mirror 220 includes multiple P-type transistors, all of which have the same threshold on-voltage (e.g., the same value of threshold voltage for P-type transistor).

In certain embodiments, similarly, if the on-voltage of a P-type transistor of the P-type current mirror 220 is substantially equal to the threshold on-voltage (e.g., the threshold voltage of the P-type transistor of the P-type current mirror 220), and if the temperature coefficient of the variable resistor 230 (e.g., the temperature coefficient of resistance) is so small that the equivalent resistance value $R_{var}$ of the variable resistor 230 is negligibly affected by the change in temperature, the controller 260 is configured to change the reference voltage $V_{DTH}$ by changing the negative temperature current $I_{ctat}$ and/or the equivalent resistance value $R_{var}$ of the variable resistor 230, thereby changing the detection threshold voltage $V_{DD}$.

In some examples, a combined current $I_{sum}$ of the characteristic current $I_p$ and the negative temperature current $I_{ctat}$ and the thermal change $\Delta I_{sum}$ of the combined current $I_{sum}$ are as follows:

$$I_{sum} = I_p + I_{ctat} \quad \text{(Equation 9)}$$

$$\Delta I_{sum} = \Delta(I_p + I_{ctat}) \quad \text{(Equation 10)}$$

and in certain examples, the reference voltage $V_{DTH}$, the thermal change $\Delta V_{DTH}$ of the reference voltage $V_{DTH}$, and the thermal change $\Delta V_{PG}$ of the characteristic voltage $V_{PG}$ are as follows:

$$V_{DTH} = (I_p + I_{ctat}) \times R_{var} \quad \text{(Equation 11)}$$

$$\Delta V_{DTH} \cong \Delta I_{sum} \cdot R_{var} = (\Delta I_p + \Delta I_{ctat}) \times R_{var} \quad \text{(Equation 12)}$$

$$\Delta V_{PG} = \Delta V_{GSP} \cong \Delta V_{THP} = K_{vth}(T - T_{ref}) \quad \text{(Equation 13)}$$

In certain examples, to achieve $\Delta V_{PG} = \Delta V_{DTH}$, the equivalent resistance value $R_{var}$ of the variable resistor 230 needs to be:

$$R_{var} = \frac{|K_{vth}|}{K_{IP} + K_{ctat}} \quad \text{(Equation 14)}$$

where $K_{vth}$ is the rate of thermal change of $|V_{THP}|$ (e.g., the absolute value of the threshold on-voltage) of a P-type transistor of the P-type current mirror 220, $K_{IP}$ is the rate of thermal change of the characteristic current $I_p$, and $K_{ctat}$ is the rate of thermal change of the negative temperature current $I_{ctat}$. In some examples, $K_{ctat}$ can be controlled by the controller 260. For example, the controller 260 modifies $K_{ctat}$ by adjusting the negative temperature current $I_{ctat}$. As an example, $K_{ctat}$ is smaller than zero. In certain examples, $K_{IP}$ and $K_{vth}$ can be predetermined by calibration. For example, $K_{vth} = -1$ mv/° C.~-2 mv/° C. As an example, $(K_{IP} + K_{ctat})$ is greater than zero, and $K_{vth}$ is less than zero.

According to some embodiments, the controller 260 is configured to change the reference voltage $V_{DTH}$ via changing the negative temperature current $I_{ctat}$ (e.g., changing $K_{ctat}$) and/or the equivalent resistance value $R_{var}$ of the variable resistor 230, thereby, for example, changing the detection threshold voltage $V_{DD}$. In certain examples, if Equation 14 is satisfied with $(K_{IP} + K_{ctat})$ being greater than zero, the output result of the brown-out detector 40 (e.g., the signal $R_{st\_out}$ as shown in FIG. 4) is almost independent from temperature variations. For example, if Equation 14 is satisfied with $(K_{IP} + K_{ctat})$ being greater than zero, the output result of the brown-out detector 40 (e.g., the signal $R_{st\_out}$ as shown in FIG. 4) almost does not change with the changing temperature. In some examples, if Equation 14 is satisfied with $(K_{IP} + K_{ctat})$ being greater than zero, the output result of the brown-out detector 40 (e.g., the signal $R_{st\_out}$ as shown in FIG. 4) is independent from temperature variations. As an example, if Equation 14 is satisfied with $(K_{IP} + K_{ctat})$ being greater than zero, the output result of the brown-out detector 40 (e.g., the signal $R_{st\_out}$ as shown in FIG. 4) does not change with the changing temperature.

In some embodiments, in order to facilitate the controller 260 to control the equivalent resistance value $R_{var}$ of the variable resistor 230, the variable resistor 230 includes multiple resistors connected in series, and each resistor of the multiple resistors has the same resistance value and the same thermal coefficient (e.g., the same temperature coefficient of resistance). For example, the variable resistor 230 includes N resistors that include resistors $R_1$ through $R_N$, and these N resistors generate N voltage levels that are not at the ground voltage level, where N is a positive integer. In certain embodiments, the N voltage levels are received by the controller 260, which selects one voltage level from the N voltage levels and outputs the selected voltage level as the reference voltage $V_{DTH}$. For example, the selected voltage level corresponds to the equivalent resistance value $R_{var}$ of the variable resistor 230. As an example, the controller 260 varies the equivalent resistance value $R_{var}$ of the variable resistor 230 by changing which of the N voltage levels is selected as the selected voltage level. For example, the controller 260 sets the equivalent resistance value $R_{var}$ of the variable resistor 230 by setting (e.g., fixing without change) which of the N voltage levels is selected as the selected voltage level.

In certain embodiments, in order to facilitate the controller 260 to control the equivalent resistance value $R_{var}$ of the variable resistor 230, the variable resistor 230 includes multiple resistors connected in series, and each resistor of the multiple resistors has the same resistance value and the same thermal coefficient (e.g., the same temperature coefficient of resistance). For example, the variable resistor 230 includes N resistors that include resistors $R_1$ through $R_N$, where N is a positive integer. As an example, as shown in FIG. 4, the controller 260 controls (e.g., varies and/or sets) the equivalent resistance value $R_{var}$ of the variable resistor 230. In some embodiments, as shown in FIG. 4, the variable resistor 230 is biased to the ground voltage level at one terminal and generates the reference voltage $V_{DTH}$ at another terminal. As an example, the generated reference voltage $V_{DTH}$ changes with the equivalent resistance value $R_{var}$ of the variable resistor 230. For example, as shown in FIG. 4, the generated reference voltage $V_{DTH}$ is received by the voltage comparator 240.

In some embodiments, a brown-out detector including a P-type current mirror, a variable resistor, a voltage comparator, and a controller. As an example, the P-type current mirror generates a characteristic voltage and a characteristic current. For example, the controller sets an equivalent resistance value of the variable resistor based on the rates of thermal change of the characteristic current and a threshold on-voltage of a P-type transistor of the P-type current mirror. As an example, the characteristic current flows through the variable resistor to generate a reference voltage, and the voltage comparator compares the characteristic voltage to the reference voltage and outputs a signal indicating the comparison result.

According to certain embodiments, a brown-out detector includes a variable resistor and a P-type current mirror including a P-type transistor associated with a threshold on-voltage. The P-type current mirror is configured to generate a characteristic voltage of a supply voltage and generate a characteristic current flowing through the variable resistor to generate a reference voltage based at least in part on the characteristic current. Additionally, the brown-out detector includes a voltage comparator configured to compare the characteristic voltage and the reference voltage and output a signal indicating a comparison result, and a controller. The threshold on-voltage is associated with a first rate of thermal change, and the characteristic current is associated with a second rate of thermal change. The controller is configured to set an equivalent resistance value of the variable resistor based at least in part on the first rate of thermal change and the second rate of thermal change. For example, the brown-out detector is implemented according to at least FIG. 2 and/or FIG. 4. As an example, the threshold on-voltage is a threshold voltage of the P-type transistor.

In some examples, the controller is further configured to set the equivalent resistance value of the variable resistor to be equal to an absolute value of the first rate of thermal change divided by the second rate of thermal change, and the first rate of thermal change indicates a rate of change of an absolute value of the threshold on-voltage with temperature. In certain examples, the characteristic voltage is associated with a third rate of thermal change, the reference voltage is associated with a fourth rate of thermal change, and the controller is further configured to set the equivalent resistance value of the variable resistor so that the third rate of thermal change and the fourth rate of thermal change are equal.

In some examples, the brown-out detector further includes a negative temperature current generator configured to, under a control of the controller, generate a negative temperature current. For example, the negative temperature current is inversely proportional to temperature. As an example, a combined current of the negative temperature current and the characteristic current is configured to flow through the variable resistor, and the controller is further configured to modify the reference voltage by modifying the negative temperature current and the equivalent resistance value of the variable resistor.

In certain examples, the brown-out detector further includes a delay circuit configured to delay the signal indicating the comparison result by a predetermined period of time. In some examples, the brown-out detector further includes a start-up circuit configured to initialize the P-type current mirror if the brown-out detector is powered on. In certain examples, the variable resistor includes multiple resistors connected in series, each resistor of the multiple resistors being associated with a same resistance value and a same thermal coefficient. In some examples, the signal indicating the comparison result is at a logic high level if the characteristic voltage is smaller than the reference voltage, and the signal indicating the comparison result is at a logic low level if the characteristic voltage is larger than the reference voltage.

According to some embodiments, a brown-out detector includes a variable resistor and a current mirror including a transistor associated with a threshold voltage. The current mirror is configured to generate a first voltage representing a supply voltage received by the current mirror and generate a first current flowing through the variable resistor to generate a second voltage based at least in part on the first current. Additionally, the brown-out detector includes a comparator configured to receive the first voltage and the second voltage and generate a comparison signal based at least in part on the first voltage and the second voltage, and a controller coupled to the variable resistor and configured to vary an equivalent resistance value of the variable resistor. An absolute value of the threshold voltage changes with temperature at a first rate of change, and the first current changes with temperature at a second rate of change. The controller is further configured to set the equivalent resistance value of the variable resistor based at least in part on the first rate of change and the second rate of change. For example, the brown-out detector is implemented according to at least FIG. 2 and/or FIG. 4.

In some examples, the current mirror is further configured to generate the first current that does not change with the supply voltage received by the current mirror. In certain examples, the current mirror is further configured to output the first current to generate the second voltage that is equal to the first current multiplied by the equivalent resistance value of the variable resistor. In some examples, the controller is further configured to set the equivalent resistance value of the variable resistor to be equal to a ratio of an absolute value of the first rate of change to the second rate of change. In certain examples, the first voltage changes with temperature at a third rate of change, the second voltage changes with temperature at a fourth rate of change, and the controller is further configured to set the equivalent resistance value of the variable resistor so that the third rate of change and the fourth rate of change are equal.

In certain examples, the brown-out detector further includes a current generator coupled to the controller and configured to generate a second current flowing through the variable resistor to generate the second voltage based at least in part on the first current and the second current. In some examples, the controller is further configured to vary the second current to vary the second voltage. In certain examples, the second voltage is equal to the equivalent resistance value of the variable resistor multiplied by a sum of the first current and the second current.

In some examples, the current generator is further configured to generate the second current that changes with temperature at a third rate of change. In certain examples, the third rate of change is smaller than zero, and the second current decreases with increasing temperature. In some examples, the first voltage changes with temperature at a fourth rate of change, the second voltage changes with temperature at a fifth rate of change, and the controller is further configured to set the equivalent resistance value of the variable resistor so that the fourth rate of change and the fifth rate of change are equal. In some examples, the controller is further configured to set the equivalent resistance value of the variable resistor to be equal to a ratio of an absolute value of the first rate of change to a sum of the second rate of change and the third rate of change.

In certain examples, the brown-out detector further includes a delay circuit configured to delay the comparison signal by a predetermined period of time and generate a reset signal. In some examples, the brown-out detector further includes a start-up circuit configured to initialize the current mirror if the brown-out detector is powered on. In certain examples, the variable resistor includes multiple resistors connected in series, each resistor of the multiple resistors being associated with a same resistance value and a same thermal coefficient. In some examples, the comparator is further configured to generate the comparison signal at a logic high level if the first voltage is smaller than the second voltage and generate the comparison signal at a logic low level if the first voltage is larger than the second voltage.

According to certain embodiments, a method for detecting a power failure includes setting an equivalent resistance value of a variable resistor, and generating a characteristic voltage of a supply voltage by a P-type current mirror including a P-type transistor associated with a threshold on-voltage. Additionally, the method includes generating a characteristic current flowing through the variable resistor, processing information associated with the characteristic current, generating a reference voltage based at least in part on the characteristic current by the variable resistor, comparing the characteristic voltage and the reference voltage, and outputting a signal indicating a comparison result based at least in part on the characteristic voltage and the reference voltage. The threshold on-voltage is associated with a first rate of thermal change, and the characteristic current is associated with a second rate of thermal change. The setting an equivalent resistance value of a variable resistor includes setting the equivalent resistance value of the variable resistor based at least in part on the first rate of thermal change and the second rate of thermal change. For example, the method is implemented according to at least FIG. 2 and/or FIG. 4. As an example, the threshold on-voltage is a threshold voltage of the P-type transistor.

In some examples, the setting the equivalent resistance value of the variable resistor based at least in part on the first rate of thermal change and the second rate of thermal change includes setting the equivalent resistance value of the variable resistor to be equal to an absolute value of the first rate of thermal change divided by the second rate of thermal change, and the first rate of thermal change indicates a rate of change of an absolute value of the threshold on-voltage with temperature. In certain examples, the characteristic voltage is associated with a third rate of thermal change, the reference voltage is associated with a fourth rate of thermal change, and the setting an equivalent resistance value of a variable resistor includes setting the equivalent resistance value of the variable resistor so that the third rate of thermal change and the fourth rate of thermal change are equal.

In some examples, the method further includes generating a negative temperature current flowing through the variable resistor, and modifying the reference voltage by modifying the negative temperature current and the equivalent resistance value of the variable resistor. In certain examples, the method further includes delaying the signal indicating the comparison result by a predetermined period of time. In some examples, the method further includes initializing the P-type current mirror. In certain examples, the variable resistor includes multiple resistors connected in series, each resistor of the multiple resistors being associated with a same resistance value and a same thermal coefficient. In some examples, the signal indicating the comparison result is at a logic high level if the characteristic voltage is smaller than the reference voltage, and the signal indicating the comparison result is at a logic low level if the characteristic voltage is larger than the reference voltage.

According to some embodiments, a method for detecting a power failure includes varying an equivalent resistance value of a variable resistor, receiving a supply voltage by a current mirror including a transistor associated with a threshold voltage, generating a first voltage representing the supply voltage by the current mirror, generating a first current by the current mirror, outputting the first current to flow through the variable resistor, generating a second voltage based at least in part on the first current, receiving the first voltage and the second voltage, and outputting a comparison signal based at least in part on the first voltage and the second voltage. An absolute value of the threshold voltage changes with temperature at a first rate of change, and the first current changes with temperature at a second rate of change. The varying an equivalent resistance value of a variable resistor includes setting the equivalent resistance value of the variable resistor based at least in part on the first rate of change and the second rate of change. For example, the method is implemented according to at least FIG. 2 and/or FIG. 4.

In some examples, the generating a first current by the current mirror includes generating the first current that does not change with the supply voltage. In certain examples, the generating a second voltage based at least in part on the first current includes generating the second voltage that is equal to the first current multiplied by the equivalent resistance value of the variable resistor. In some examples, the varying an equivalent resistance value of a variable resistor includes setting the equivalent resistance value of the variable resistor to be equal to a ratio of an absolute value of the first rate of change to the second rate of change. In certain examples, the first voltage changes with temperature at a third rate of change, the second voltage changes with temperature at a fourth rate of change, and the varying an equivalent resistance value of a variable resistor includes making the third rate of change and the fourth rate of change equal.

In certain examples, the method further includes generating a second current flowing through the variable resistor, wherein the generating a second voltage based at least in part on the first current includes generating the second voltage based at least in part on the first current and the second current. In some examples, the method further includes varying the second current to vary the second voltage. In certain examples, the second voltage is equal to the equivalent resistance value of the variable resistor multiplied by a sum of the first current and the second current.

In some examples, the generating a second current flowing through the variable resistor includes generating the second current that changes with temperature at a third rate of change. In certain examples, the third rate of change is smaller than zero. For example, the second current decreases with increasing temperature. As an example, the second current increases with decreasing temperature. In some examples, the first voltage changes with temperature at a fourth rate of change, the second voltage changes with temperature at a fifth rate of change, and the varying an equivalent resistance value of a variable resistor includes making the fourth rate of change and the fifth rate of change equal. In some examples, the varying an equivalent resistance value of a variable resistor includes setting the equivalent resistance value of the variable resistor to be equal to a ratio of an absolute value of the first rate of change to a sum of the second rate of change and the third rate of change.

In certain examples, the method further includes delaying the comparison signal by a predetermined period of time and generating a reset signal. In some examples, the method further includes initializing the current mirror. In certain examples, the variable resistor includes multiple resistors connected in series, each resistor of the multiple resistors being associated with a same resistance value and a same thermal coefficient. In some examples, the outputting a comparison signal based at least in part on the first voltage and the second voltage includes generating the comparison signal at a logic high level if the first voltage is smaller than the second voltage, and generating the comparison signal at a logic low level if the first voltage is larger than the second voltage.

According to certain embodiments, the present invention can be implemented in other examples without departing from one or more essential characteristics. As an example, various embodiments are to be considered in all aspects as exemplary but not limiting.

For example, some or all components of various embodiments of the present invention each are, individually and/or in combination with at least another component, implemented using one or more software components, one or more hardware components, and/or one or more combinations of software and hardware components. As an example, some or all components of various embodiments of the present invention each are, individually and/or in combination with at least another component, implemented in one or more circuits, such as one or more analog circuits and/or one or more digital circuits. For example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A brown-out detector comprising:
   a variable resistor;
   a current mirror including a transistor associated with a threshold voltage, the current mirror being configured to generate a first voltage representing a supply voltage received by the current mirror and generate a first current flowing through the variable resistor to generate a second voltage based at least in part on the first current;
   a comparator configured to receive the first voltage and the second voltage and generate a comparison signal based at least in part on the first voltage and the second voltage; and
   a controller coupled to the variable resistor and configured to vary an equivalent resistance value of the variable resistor;
   wherein:
      an absolute value of the threshold voltage changes with temperature at a first rate of change; and
      the first current changes with temperature at a second rate of change;
   wherein the controller is further configured to set the equivalent resistance value of the variable resistor based at least in part on the first rate of change and the second rate of change.

2. The brown-out detector of claim 1 wherein the current mirror is further configured to generate the first current that does not change with the supply voltage received by the current mirror.

3. The brown-out detector of claim 1 wherein the current mirror is further configured to output the first current to generate the second voltage that is equal to the first current multiplied by the equivalent resistance value of the variable resistor.

4. The brown-out detector of claim 1 wherein the controller is further configured to set the equivalent resistance value of the variable resistor to be equal to a ratio of an absolute value of the first rate of change to the second rate of change.

5. The brown-out detector of claim 1 wherein:
   the first voltage changes with temperature at a third rate of change;
   the second voltage changes with temperature at a fourth rate of change; and
   the controller is further configured to set the equivalent resistance value of the variable resistor so that the third rate of change and the fourth rate of change are equal.

6. The brown-out detector of claim 1, and further comprising a current generator coupled to the controller and configured to generate a second current flowing through the variable resistor to generate the second voltage based at least in part on the first current and the second current.

7. The brown-out detector of claim 6 wherein the controller is further configured to vary the second current to vary the second voltage.

8. The brown-out detector of claim 6 wherein the second voltage is equal to the equivalent resistance value of the variable resistor multiplied by a sum of the first current and the second current.

9. The brown-out detector of claim 6 wherein the current generator is further configured to generate the second current that changes with temperature at a third rate of change.

10. The brown-out detector of claim 9 wherein:
    the third rate of change is smaller than zero; and
    the second current decreases with increasing temperature.

11. The brown-out detector of claim 9 wherein:
    the first voltage changes with temperature at a fourth rate of change;
    the second voltage changes with temperature at a fifth rate of change; and
    the controller is further configured to set the equivalent resistance value of the variable resistor so that the fourth rate of change and the fifth rate of change are equal.

12. The brown-out detector of claim 9 wherein the controller is further configured to set the equivalent resistance value of the van able resistor to be equal to a ratio of an absolute value of the first rate of change to a sum of the second rate of change and the third rate of change.

13. The brown-out detector of claim 1, and further comprising a delay circuit configured to delay the comparison signal by a predetermined period of time and generate a reset signal.

14. The brown-out detector of claim 1, and further comparing a start-up circuit configured to initialize the current mirror if the brown-out detector is powered on.

15. The brown-out detector of claim 1 wherein the variable resistor includes multiple resistors connected in series, each resistor of the multiple resistors being associated with a same resistance value and a same thermal coefficient.

16. The brown-out detector of claim 1 wherein the comparator is further configured to generate the comparison signal at a logic high level if the first voltage is smaller than the second voltage and generate the comparison signal at a logic low level if the first voltage is larger than the second voltage.

17. A method for detecting a power failure, the method comprising:
    varying an equivalent resistance value of a variable resistor;
    receiving a supply voltage by a current mirror including a transistor associated with a threshold voltage;
    generating a first voltage representing the supply voltage by the current mirror;
    generating a first current by the current mirror;
    outputting the first current to flow through the variable resistor;
    generating a second voltage based at least in part on the first current;
    receiving the first voltage and the second voltage; and
    outputting a comparison signal based at least in part on the first voltage and the second voltage;
    wherein:
       an absolute value of the threshold voltage changes with temperature at a first rate of change; and
       the first current changes with temperature at a second rate of change;
    wherein the varying an equivalent resistance value of a variable resistor includes setting the equivalent resistance value of the variable resistor based at least in part on the first rate of change and the second rate of change.

18. The method of claim 17 wherein the generating a first current by the current mirror includes generating the first current that does not change with the supply voltage.

19. The method of claim 17 wherein the generating a second voltage based at least in part on the first current includes generating the second voltage that is equal to the first current multiplied by the equivalent resistance value of the variable resistor.

20. The method of claim 17 wherein the varying an equivalent resistance value of a variable resistor includes setting the equivalent resistance value of the variable resistor to be equal to a ratio of an absolute value of the first rate of change to the second rate of change.

21. The method of claim 17 wherein:
the first voltage changes with temperature at a third rate of change;
the second voltage changes with temperature at a fourth rate of change; and
the varying an equivalent resistance value of a variable resistor includes making the third rate of change and the fourth rate of change equal.

22. The method of claim 17, and further comprising:
generating a second current flowing through the variable resistor;
wherein the generating a second voltage based at least in part on the first current includes generating the second voltage based at least in part on the first current and the second current.

23. The method of claim 22, and further comprising varying the second current to vary the second voltage.

24. The method of claim 22 wherein the second voltage is equal to the equivalent resistance value of the variable resistor multiplied by a sum of the first current and the second current.

25. The method of claim 22 wherein the generating a second current flowing through the variable resistor includes generating the second current that changes with temperature at a third rate of change.

26. The method of claim 25 wherein the third rate of change is smaller than zero.

27. The method of claim 26 wherein the second current decreases with increasing temperature.

28. The method of claim 26 wherein the second current increases with decreasing temperature.

29. The method of claim 25 wherein:
the first voltage changes with temperature at a fourth rate of change;
the second voltage changes with temperature at a fifth rate of change; and
the varying an equivalent resistance value of a variable resistor includes making the fourth rate of change and the fifth rate of change equal.

30. The method of claim 25 wherein the varying an equivalent resistance value of a variable resistor includes setting the equivalent resistance value of the variable resistor to be equal to a ratio of an absolute value of the first rate of change to a sum of the second rate of change and the third rate of change.

31. The method of claim 17, and further comprising:
delaying the comparison signal by a predetermined period of time; and
generating a reset signal.

32. The method of claim 17, and further comprising initializing the current mirror.

33. The method of claim 17 wherein the variable resistor includes multiple resistors connected in series, each resistor of the multiple resistors being associated with a same resistance value and a same thermal coefficient.

34. The method of claim 17 wherein the outputting a comparison signal based at least in part on the first voltage and the second voltage includes:
generating the comparison signal at a logic high level if the first voltage is smaller than the second voltage; and
generating the comparison signal at a logic low level if the first voltage is larger than the second voltage.

* * * * *